United States Patent [19]
Lee

[11] Patent Number: 5,922,217
[45] Date of Patent: Jul. 13, 1999

[54] METHOD FOR CORRECTING DEFECTS IN A PHASE SHIFT MASK

[75] Inventor: Jun Seok Lee, Seoul, Rep. of Korea

[73] Assignee: LG Semicon., Ltd., Chungcheongbuk-do, Rep. of Korea

[21] Appl. No.: 08/859,261

[22] Filed: May 20, 1997

Related U.S. Application Data

[30] Foreign Application Priority Data

Jun. 27, 1996 [KP] DPR of Korea .................. 96-24698

[51] Int. Cl.$^6$ ........................................ B44C 1/22
[52] U.S. Cl. ................................. 216/24; 216/41
[58] Field of Search ........................ 216/11, 21, 24, 216/41, 60, 79

[56] References Cited

U.S. PATENT DOCUMENTS 5,468,337 11/1995 Miyatake ................... 216/24
5,569,392 10/1996 Miyoshi et al. ............. 216/24 X

*Primary Examiner*—William Powell

[57] ABSTRACT

A method for correcting defects in a phase shift mask is disclosed. The method includes the steps of: forming an etch stopper layer and a phase shift layer on a substrate in succession; forming light shielding layer patterns on the phase shift layer, the light shielding layer patterns having a plurality of opened regions; defining phase shift regions on selected regions of the phase shift layer in the opened regions; selectively removing the phase shift layer in the phase shift regions to a thickness required for phase shifting; and eliminating a defect by simultaneous further etching the same amount of material from the defective phase shift layer and an adjacent open region. This corrects the defect by converting the defective phase shift region to a non-phase-shift region and converting the adjacent open region into a phase shift region.

37 Claims, 8 Drawing Sheets

METHOD FOR CORRECTING DEFECTS IN A PHASE SHIFT MASK

FIELD OF THE INVENTION

The present invention relates to a phase shifting mask, and more particularly, to method for correcting defects in a phase shift mask.

BACKGROUND OF THE INVENTION

In general, a photomask (having a part for transmitting light and another part for shielding light) is mostly used in photolithography, especially as applied to semiconductor device fabricating processes. However, the general photomask, which has such a light transmission pattern and a light shielding pattern for selective exposure, has a limitation in improving its resolution because of diffraction coming from increased pattern packing density. Therefore, research for improving the resolution in the phase shift mask has been under way in many fields.

The phase shifting mask combines light transmissive regions (which transmit light without shifting it in phase) and light shifting transmissive regions (which transmit light phase-shifted by 180°). As light passes through an opening such as a light transmitting region it diffracts, which leads to unwanted constructive interference in areas between light transmitting regions. To reduce this unwanted constructive interference, the light shifting regions are provided to create destructive interference by way of 180°-phase-shifted light. Such phase shift masks have improved resolution.

For fabrication of an accurate phase shift mask, defect inspection and defect correction must be conducted. The defects can occur during a mask pattern fabricating process or a photolithography process for a substrate or a phase shift layer. The defects affect the yield of the masks.

A conventional method for correcting defects in a phase shift mask will be explained with reference to the attached drawings. FIGS. 1a to 1d illustrate sections showing one example of the steps of the conventional method for correcting a defect in a phase shift mask.

Referring to FIG. 1a, a plurality of portions 2 of a light shielding pattern are formed in predetermined intervals on a light transmissive substrate 1, and a resist 3 is deposited on an entire surface of the light shielding pattern. As shown in FIG. 1b, a trench region is defined on the resist 3, and patterned by exposure and development of the resist 3. Then, the light transmissive substrate 1 is etched to a predetermined depth using the patterned resist 3 as a mask, to form a trench 4, which is a phase shift region.

The trench 4 is formed in the light transmissive substrate 1 to alternate between portions 2 of the light shielding pattern. In the formation of the trench 4, a defective region 5 occurs due to residue of a reaction between an etch gas and the light transmissive substrate 1.

As shown in FIG. 1c, an FIB (Focused Ion Beam) 6 is used to selectively remove the defect in the defective region 5. To be sufficient to remove the defect, the energy of the ion beam is large enough so that the beam can also disrupt the crystal lattice of the light transmissive substrate, i.e., one defect is possibly traded for another. As shown in FIG. 1d, the resist 3 is removed to complete fabrication of a phase shift mask that selectively induces opposite phases in the light passing through it.

Another example of the conventional method for correcting defects in a phase shift mask will be explained. FIGS. 2a to 2e illustrate sections showing another example of the steps of the conventional method for correcting a defect in a phase shift mask.

Referring to FIG. 2a, a plurality of portions 11 of a light shielding layer pattern are formed at predetermined intervals on a light transmissive substrate 10 having a dummy region 18 and a main region 19. The light shielding pattern is formed only in the main region 19. Then, trenches 12 are formed in the exposed light transmissive substrate 10 to alternate between the portions 11 of the light shielding pattern. A defective region 13 of non-etched substrate 10 has occurred at one of the trenches 12.

Referring to FIG. 2b, a polymer layer 14, a chrome layer 15 and a resist layer 16 are formed on an entire surface in succession, and the resist layer 16 is patterned to a width wider than the defective region 13 at the trench 12 in the main region 19. The resist layer 16 in the dummy region 18 at a position of a trench formation is patterned in the same way. In this case, the polymer 14 is selected which has the same etch selectivity as the light transmissive substrate 10.

Referring to FIG. 2c, the chrome layer 15 and the polymer layer 14 in the main and dummy regions 19 and 18 are etched (using the patterned resist layer 16 as a mask) until the detective region 13 is exposed. Then, the resist layer 16 is removed.

Referring to FIG. 2d, the defective region 13 in the main region 19 is etched. As the etching speeds are the same, the polymer layer 14 in the dummy region 18 and the defective region 13 are etched at the same speed. That is, the polymer layer 14 in the dummy region 18 as well as the defective region 13 at the trench 12 are etched on the same time until the light transmissive substrate 1 underneath the polymer layer 14 in the dummy region 18 is exposed. And, as shown in FIG. 2e, the polymer layer 14 is removed. In this case, the chrome layer 15 is removed automatically if the etching used in the removal of the polymer layer 14 is a wet etching.

The conventional methods for correcting defects in a phase shift mask discussed above, have the following problems.

First, the use of FIB in removal of the defective region can not remove only the defective region effectively, and causes errors in phase shifting due to the damage from the FIB.

Second, the use of a dummy region in correcting a defect additionally requires formation of the polymer layer, chrome layer and resist layer, as well as processes of alignment, exposure and development. This complicates the process, and reduces the device packing density.

Third, the etching of the substrate underneath the polymer layer in the dummy region has a problem that reworking can be hardly done once the substrate is damaged.

SUMMARY OF THE INVENTION

Accordingly, the present invention is directed to a method for correcting a defect in a phase shift mask that substantially obviates one or more of the problems due to limitations and disadvantages of the related art.

An object of the present invention is to provide a method for easily correcting a defect in a phase shift mask.

To achieve these and other advantages and in accordance with the purpose of the present invention, as embodied and broadly described, the method for correcting a defect in a phase shift mask includes the steps of forming an etch stopper layer and phase shift layer in succession; forming a light shielding layer pattern on the phase shift layer, the light shielding layer pattern having a plurality of open regions; defining phase shift regions on selected regions of the phase shift layer exposed by the open regions; selectively removing the phase shift layer in the phase shift regions to a thickness required for phase shifting; and eliminating a defect in a phase shift region by simultaneously selectively removing the same amount of phase shift layer material in an adjacent non-phase shift open region as is removed from the defective phase shift region. This converts the adjacent open region into a phase shift region and the defective phase shift region into a non-phase shift region, this correcting the defect.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings are presented as exemplary illustrations and are not limitative of the present invention, are incorporated in and constitute a part of this specification, illustrate embodiments of the invention, and together with the description serve to explain the principles of the present invention.

In the drawings.

DETAILED DESCRIPTION OF THE PREFERRED EMBODIMENT

Reference will now be made in detail to the preferred embodiments of the present invention, examples of which are illustrated in the accompanying drawings.

FIGS. 3a~3f illustrate sections showing the steps of a method for correcting a defect in a phase shift mask in accordance with a first embodiment of the present invention.

Figure 1A:
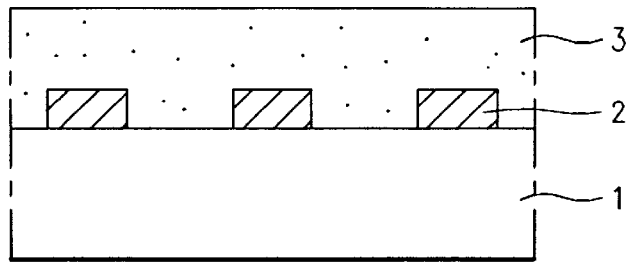
FIGS. 1a~d illustrate sections showing one example of the steps of a conventional method for correcting a defect in a phase shift mask.
Figure 1B:
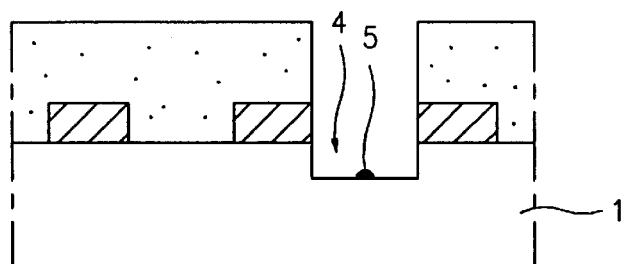
Figure 1C:
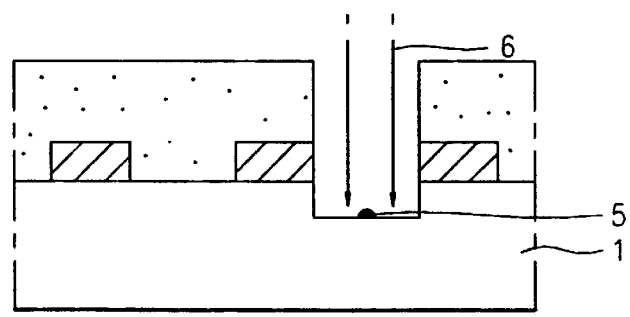
Figure 1D:
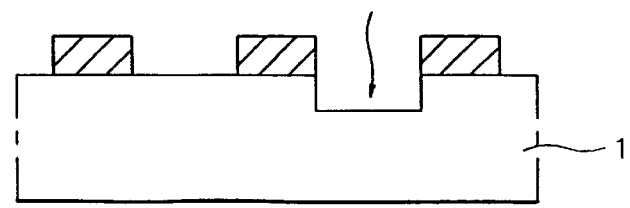
Figure 2A:
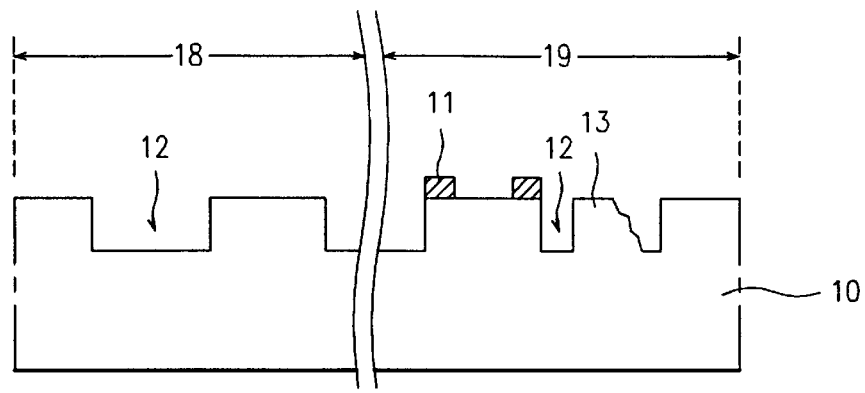
FIGS. 2a~2e illustrate sections showing another example of the steps of a conventional method for correcting a defect in a phase shift mask.
Figure 2B:
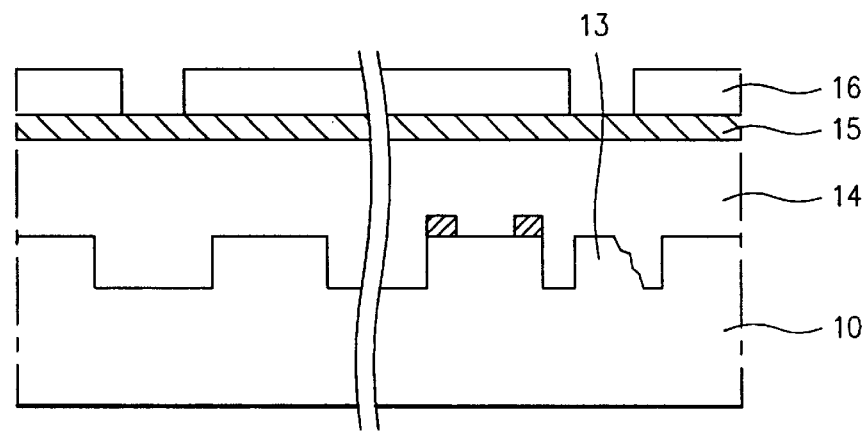
Figure 2C:
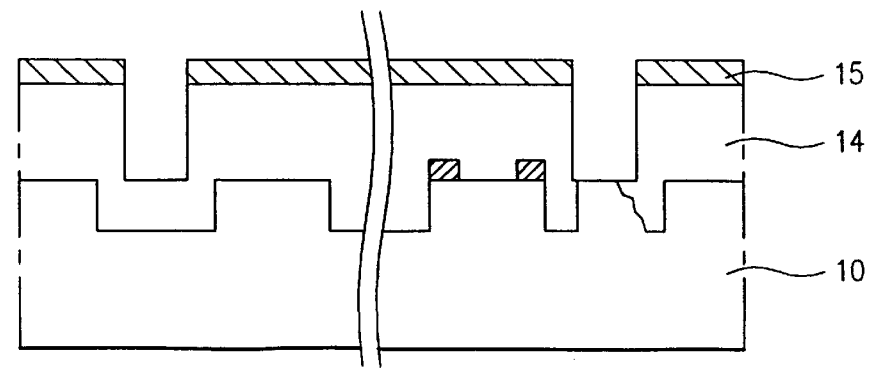
Figure 2D:
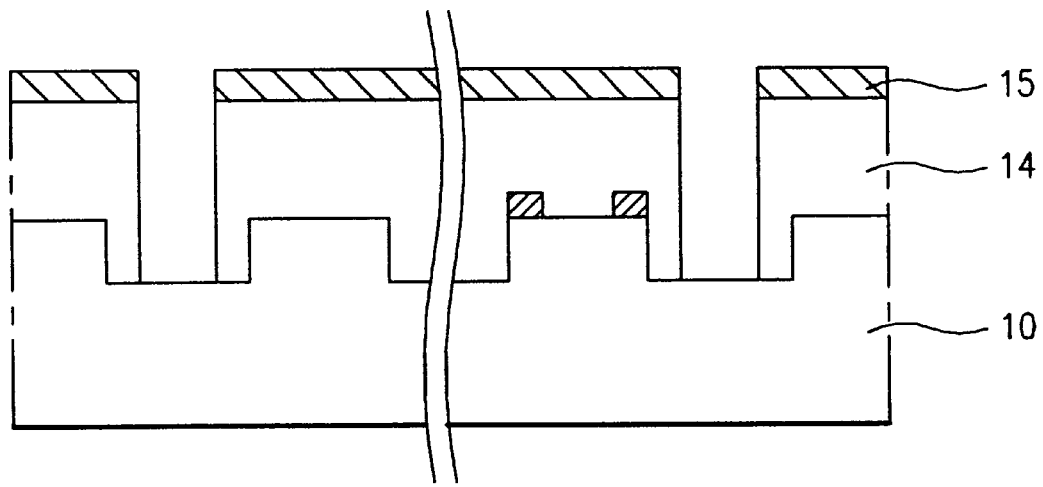
Figure 2E:
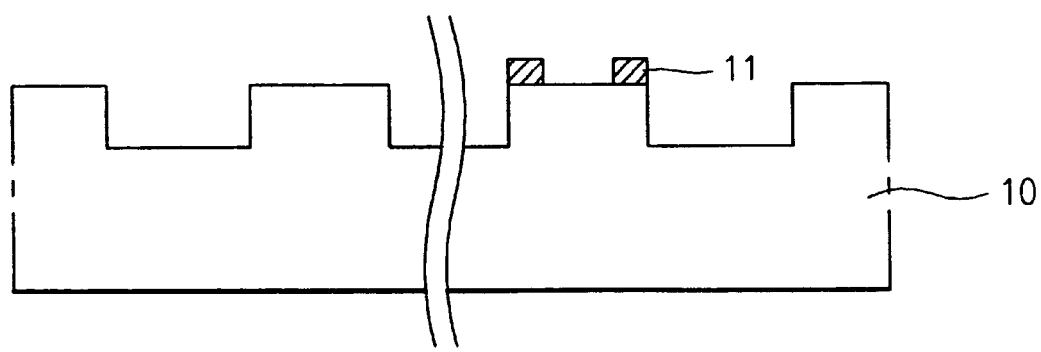
Figure 3A:
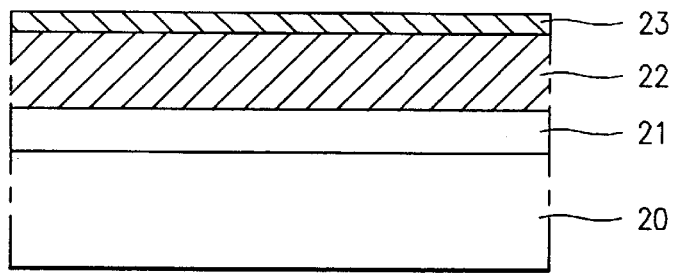
FIGS. 3a~3f illustrate sections showing the steps of a method for correcting a defect in a phase shift mask in accordance with a first embodiment of the present invention; and, FIGS. 4a~4g illustrate sections showing the steps of method for correcting a defect in a phase shift mask in accordance with a second embodiment of the present invention.

Referring to FIG. 3a, an etch stopper layer 21, a phase shift layer 22 and an inorganic light shielding layer 23 are formed on a light transmissive substrate in succession.

In this case, the phase shift layer 22 (e.g., SOG or $SiO_2$) is formed to have a thickness of 1.5d~3.0d, e.g., 2d (which simplifies the manufacturing process), where the variable, d, represents a thickness required for causing a phase shift in light passing through it.

The variable, d, can be expressed in the following equation;

$$d=\lambda/2(n-1),$$

where $\lambda$ is a wavelength of a light source, and the variable, n, is a refractive index of a phase shifting material.

Chromium, for example, is used as the light shielding layer 23.

Figure 3B:
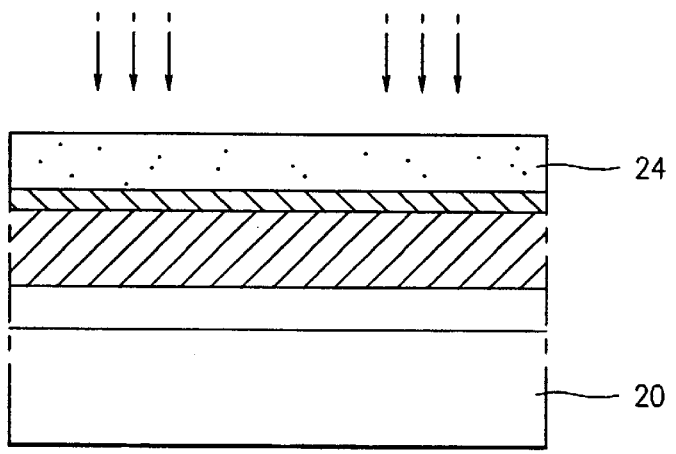
Figure 3C:
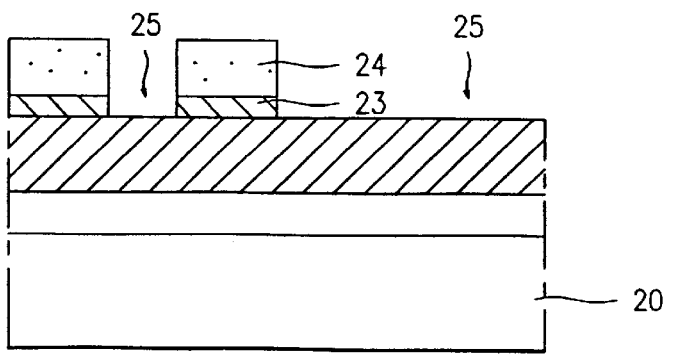

Referring to FIG. 3b, a first photo resist for an electron beam is formed on an entire resultant surface, and the electron beam is selectively directed only to areas that will become open regions. As shown in FIG. 3c, the first resist is developed to form a first resist pattern 24. Then, the first resist pattern 24 is used as a mask for the etching that produces a light shielding layer pattern 23 having light transmissive regions 25. The light transmissive regions 25 are open regions.

Figure 3D:
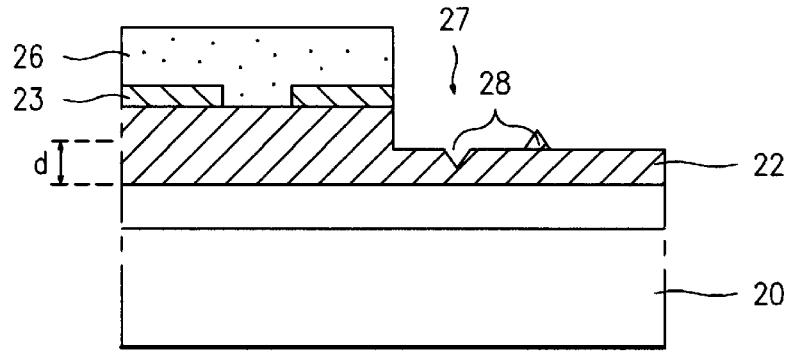

Referring to FIG. 3d, the first resist pattern 24 is removed. Then, a second resist is formed, and portions of the second resist are selectively removed (over what will become phase shift regions) to form a second resist pattern 26. The second resist pattern 26 is formed to include the light shielding pattern 23 and to alternately expose the open regions. The second resist pattern 26 is used as a mask in the etching of the exposed phase shift layer 22 down to a phase shifting thickness d. That is, as shown in FIG. 3d, the phase shift layer 22 is etched to the thickness of $d=\lambda/2(n-1)$. The etched phase shift layer 22 has been converted from a non-phase shifting light transmissive region 25 to a phase shifting light transmissive region 27 which transmits light, shifting its phase by 180° relative to the phase of light which passes unaffected through the light transmissive region.

In case there are no defects that occurred in the etched phase shift layer 22, the second resist pattern 26 is removed.

However, as shown in FIG. 3d, it is assumed that defects 28 have occurred, such as an etch residue on the phase shift layer 22 or damage in the phase shift layer 22. For the particular mask being produced, there are predetermined alternate arrangements (of non-phase shifting regions and phase-shifting regions) that selectively transmit light in an equivalent manner. When a defect in a phase-shifting region is discovered, an alternate arrangement of a non-phase shifting and phase-shifting pair of regions is selected as an equivalent replacement for the defective phase shifting region.

Figure 3E:
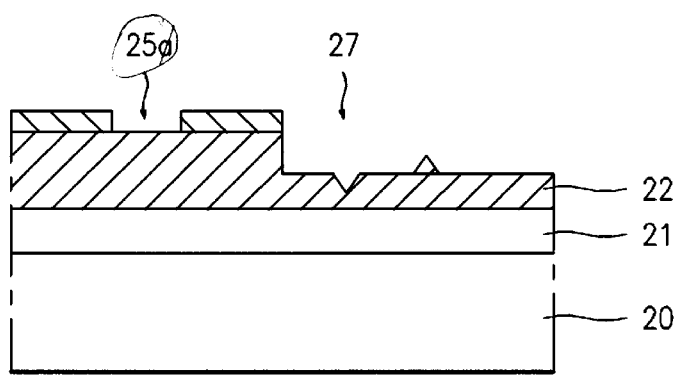

Referring to FIG. 3e, the second resist pattern 26 is removed, and the phase shift layer 22 in the light transmissive region 25 and the phase shift layer 22 in the phase shifting light transmissive region 27 are dry etched, simultaneously, using a third resist (not shown). The third resist is patterned to permit etching only of the defective phase shifting region and the non-phase shifting region that will be converted to a phase shifting region 25a. The etch stopper layer 21 is used as an etch stopping point.

Figure 3F:
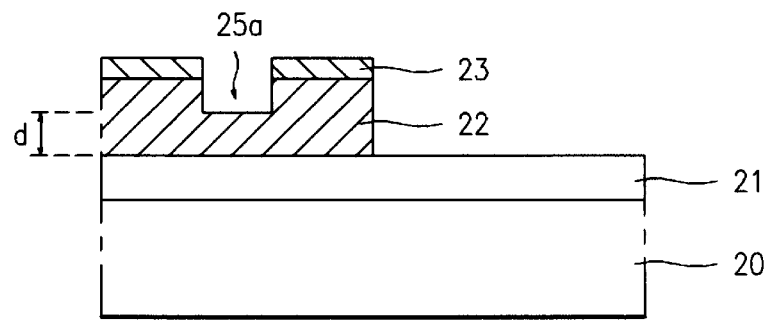

Referring to FIG. 3f, the defective region 28 (that had occurred in the phase shift layer 22 in the phase shifting light transmissive layer 27) has been eliminated while a phase shift region 25a that maintains a required phase shifting thickness d has been formed in what used to be the non-phase-shifting light transmissive region 25. Even if a defect should occur in the phase shift mask 25a, the defect can be eliminated by using an identical method in a simultaneous etching of the phase shift layers 22 exposed between the light shielding layer patterns 23.

A method for correcting a defect in a phase shift mask in accordance with a second embodiment of the present invention will be explained.

FIGS. 4a~4g illustrate sections showing the steps of a method for correcting a defect in a phase shift mask in accordance with a second embodiment of the present invention.

Figure 4A:
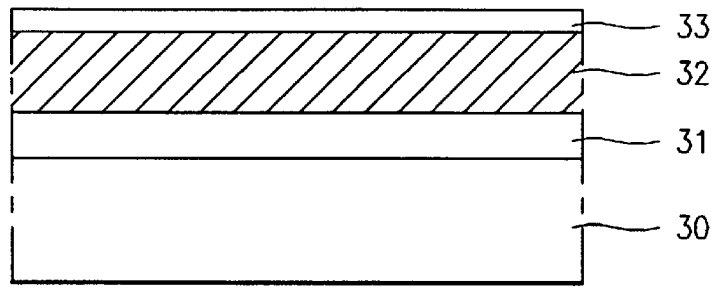

Referring to FIG. 4a, an etch stopper layer 31, a phase shift layer 32 and a first resist 33 are formed on a light transmissive substrate 30 in succession.

In this case, the phase shift layer 32 is formed to have a thickness of 1.5d~3.0d, e.g., 2d, where the variable, d, represents a thickness required for occurring a phase shifting.

The variable, d, can be expressed in the following equation:

$$d=\lambda/2(n-1),$$

where $\lambda$ is a wavelength of a light source, and the variable, n, is a refractive index of a phase shifting material.

The first resist is formed of a well known inorganic resist.

Figure 4B:
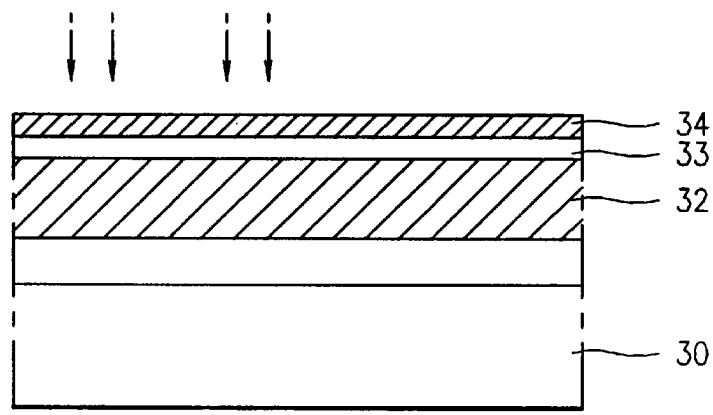
Figure 4C:
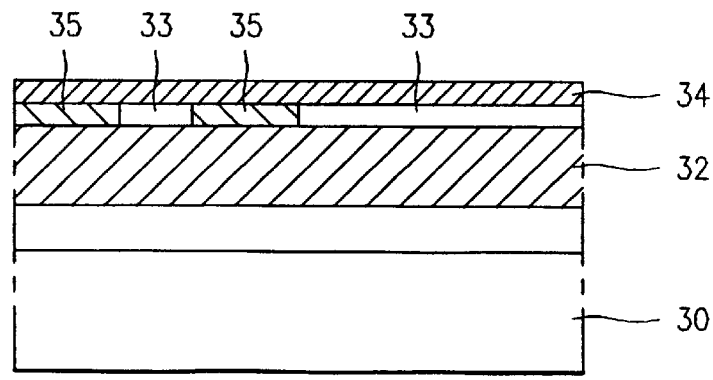

Referring to FIG. 4b, an impurity doped layer 34 is formed on an entire surface of the first resist 33. In this case, the impurity doped layer 34 includes silver (Ag). For example, the structure of FIG. 4a is dipped into a solution of AgNO$_3$ to form the layer or coating 34. An electron beam is selectively directed only to areas that will become light shielding regions using an electron bean direct plotting method. Accordingly, as shown in FIG. 4c, the silver in the impurity doped layer 34 is selectively diffused into the first resist 33 to which the electron beam has been directed selectively to form portions 35 of a light shielding layer pattern.

Figure 4D:
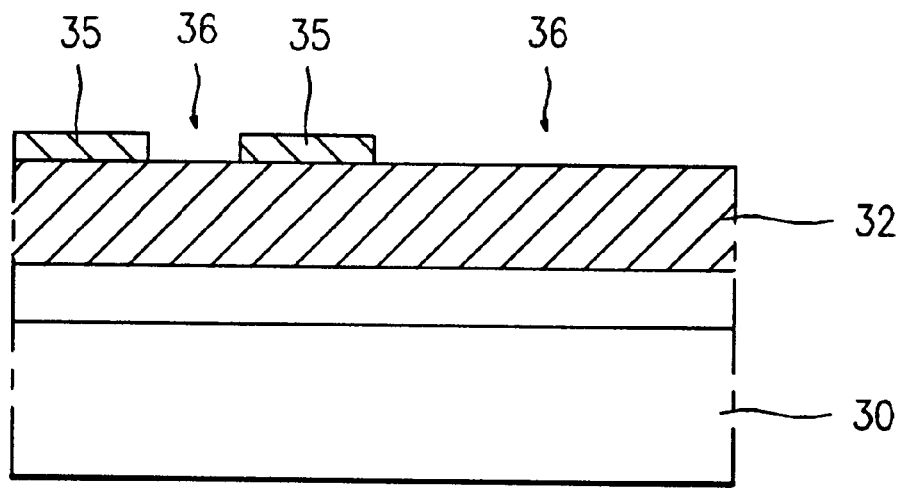

Referring to FIG. 4d, the impurity doped layer 34 and the first resist 33 are removed by acid and alkali solution in succession to form light transmissive regions 36. The light transmissive regions are open regions.

Figure 4E:
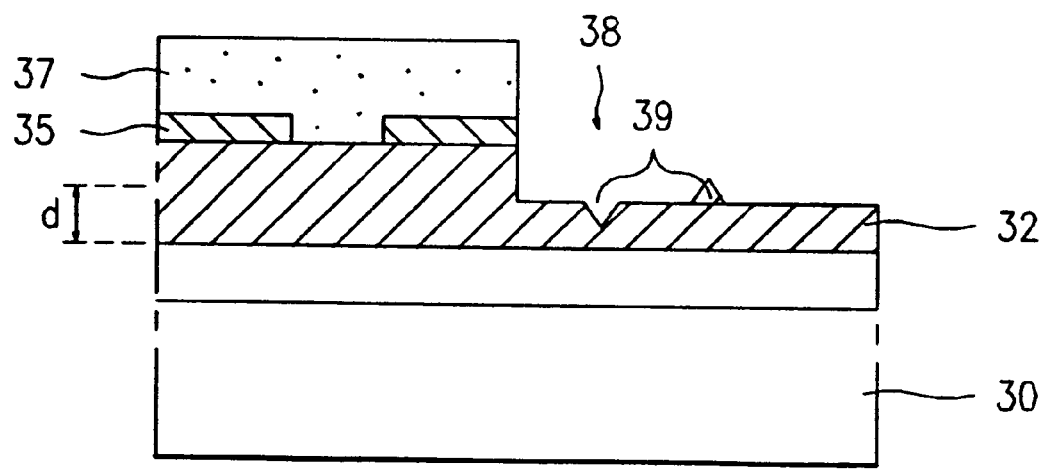

Referring to FIG. 4e, a second resist is formed on an entire resultant surface, and the second resist over what will become a phase shift region is selectively removed to form a second resist pattern 37. The second resist pattern 37 is formed to include the light shielding pattern 35 and to alternate with the open region. The second resist pattern 37 is used as a mask in the etching of the exposed phase shift layer 32 on one side thereof to a phase shifting thickness d. As shown in FIG. 4e, the phase shift layer 32 has become etched down to the thickness of d=$\lambda$/2 (n-1). The etched phase shift layer 32 is a phase shifting light transmissive region 38 which transmits light, shifting its phase by 180° from the phase of light which passes through the light transmissive region unaffected.

In the case that no defects occur in the etched phase shift layer 32, the second resist pattern 37 is removed.

However, as shown in FIG. 4e, it is assumed that there is a defective region 39 that has occurred, such as an etch residue on the phase shift layer 32 or damage in the phase shift layer 32.

Figure 4F:
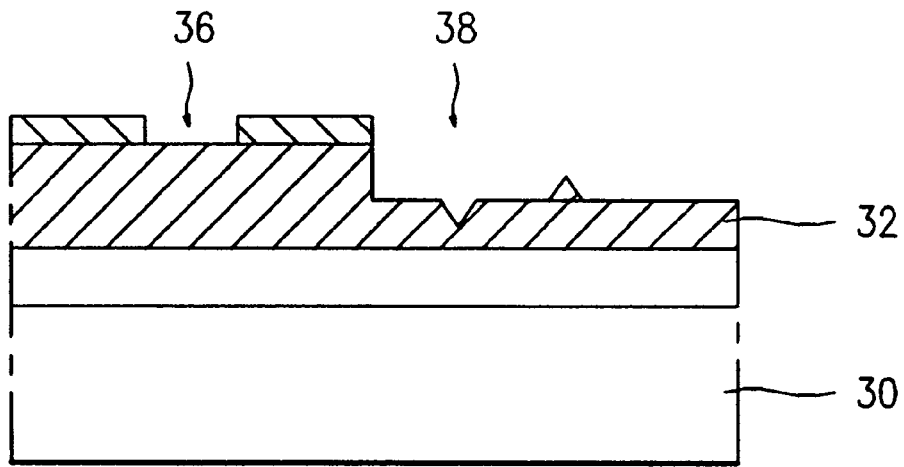

Referring to FIG. 4f, the second resist pattern 37 is removed, and the phase shift layer 32 in the light transmissive region 36 and the phase shift layer 32 in the phase shifting light transmissive region 38 are dry etched, simultaneously, e.g., in the manner discussed above. The etch stopper layer 31 is used as an etch stopping point.

Figure 4G:
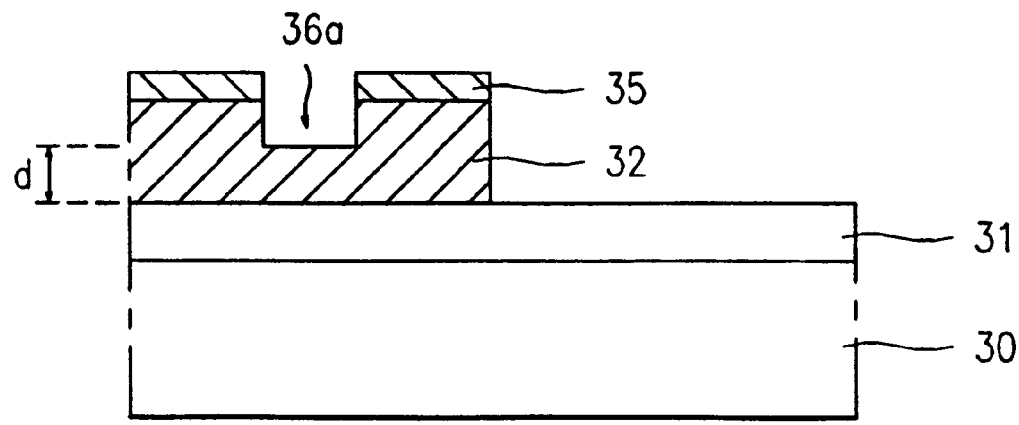

Referring to FIG. 4g, the defective region 39 that had occurred in the phase shift layer 32 in the phase shifting light transmissive region 38 has been eliminated, while a phase shift mask 36a that maintains a required phase shifting thickness d has been formed in what used to be the adjacent light transmissive region 36. Even if a defect should occur in the phase shift layer, the defect can be eliminated by using an identical method in a simultaneous etching of the phase shift layer 32 exposed between the light shielding layer patterns 35.

As has been explained, the method for correcting a defect in a phase shift mask in accordance with the present invention has the following advantages.

First, the formation of a phase shift layer thicker than a thickness required for shifting a phase permits an easy correction of a defect.

Second, even if a defect should occur in any of the surfaces of the light transmissive region (that transmits a light unaffected) or the phase shifting light transmissive region correction of the defect is easy.

Third, because a defect can be corrected while maintaining a phase difference between adjacent patterns as it is, a stable reliability can be provided.

Fourth, the use of inorganic resist including silver as the light shielding pattern, which has a higher selectivity over a phase shift layer, permits easy correction of a defect.

Fifth, the etch stopper layer formed on the substrate allows the defect correcting etching process to be more stable, i.e., more resistant to damage.

It will be apparent to those skilled in the art that various modifications and variations can be made in method for fabricating semiconductor device of the present invention without departing from the spirit or scope of the invention. Thus, it is intended that the present invention cover the modifications and variations of this invention as would be obvious to one of ordinary skill in the art are intended to be included within tho scope of the appended claims and their equivalents.

What is claimed is:

1. A method for correcting a defect in a phase mask comprising the steps of:

providing a substrate;

forming an etch stopper layer on the substrate;

forming a phase shift layer on the etch stopper layer;

forming a light shielding layer on the phase shift layer;

selectively removing portions of the light shielding layer to form a light shielding pattern having open regions through which light can pass;

selectively removing, for a number of areas exposed by the open regions, a first amount of the phase shift layer material to produce phase shift regions having a thickness of remaining phase shift layer material sufficient to induce a phase shift in light passing therethrough;

eliminating a defect in a phase shift region by simultaneously selectively removing a second amount of phase shift layer material in each of the defective phase shaft region and a portion of the phase shift layer exposed by an adjacent opinion region, such that the defective phase shift region is converted to a non-phase-shifting region and the adjacent open region is converted to a phase shift region.

2. A method as claimed in claim 1, wherein the step of providing a substrate includes using a light transmissive material as the substrate.

3. A method as claimed in claim 1, wherein the step of selectively removing to produce phase shift regions includes using alternate open regions for the selective removal of the phase shift layer material.

4. A method as claimed in claim 1, wherein the step of forming a light shielding pattern includes using an inorganic resist including chrome or silver.

5. A method as claimed in claim 1, wherein the step of forming a phase shift layer includes using a material including SOG or SiO$_2$ as the phase shift layer.

6. A method as claimed in claim 1, wherein the step of selectively removing to produce phase shift regions includes setting the thickness of the remaining phase shift layer material according to the following equation:

$$d=\lambda/2(n-1),$$

where d is the thickness required for phase shifting, λ is a wavelength of a light source, and n is a refractive index of the phase shift layer material.

7. A method as claimed in claim 1, wherein the step of eliminating a defect by simultaneously selectively removing includes etching the phase shift layer.

8. A method as claimed in claim 1, wherein the step of selectively removing to produce phase shift regions includes setting the thickness of the phase shift layer in the phase shift regions to be 1.5d~3.0d, where d is a thickness required for phase shifting.

9. A method for correcting a defect in a phase mask comprising the steps of:
   providing a substrate;
   forming an etch stopper layer on the substrate;
   forming a phase shift layer on the etch stopper layer;
   forming a light shielding layer on the phase shift layer;
   forming a photo resist on the light shielding layer;
   patterning the photo resist with an electron beam;
   etching, using the patterned photo resist as a mask, portions of the light shielding layer so as to form a light shielding pattern having open regions through which light can pass;
   selectively etching, for a number of areas exposed by the open regions, a first amount of the phase shift layer material to produce phase shift regions having a thickness of remaining phase shift layer material sufficient to induce a phase shift in light passing therethrough;
   eliminating a defect in a phase shift region by simultaneously selectively etching a second amount of phase shift layer material in each of the defective phase shift region and a portion of the phase shift layer exposed by an adjacent open region, such that the defective phase shift region is converted to a non-phase-shifting region and the adjacent open region is converted to a phase shift region.

10. A method as claimed in claim 9, wherein the step of providing a substrate includes using a light transmissive material as the substrate.

11. A method as claimed in claim 9, wherein the step of selectively removing to produce phase shift regions includes using alternate open regions for the selective removal of the phase shift layer material.

12. A method as claimed in claim 9, wherein each step of forming a light shielding pattern includes using an inorganic resist including chrome or silver.

13. A method as claimed in claim 9, wherein the step of forming a phase shift layer includes using a material including SOG or SiO$_2$ as the phase shift layer.

14. A method as claimed in claim 9, wherein the step of selectively removing to produce phase shift regions includes setting the thickness of the remaining phase shift layer material according to the following equation:

$$d=\lambda/2(n-1),$$

where d is the thickness required for phase shifting, λ is a wavelength of a light source, and n is a refractive index of the phase shift layer material.

15. A method as claimed in claim 9, wherein the step of eliminating a defect by simultaneously selectively removing includes etching the phase shift layer.

16. A method as claimed in claim 9, wherein a step of selectively removing to produce phase shift regions includes setting the thickness of the phase shift layer in the phase shift regions to be 1.5d~3.0d, where d is a thickness required for phase shifting.

17. A method for correcting a defect in a phase mask comprising the steps of:
   providing a substrate;
   forming an etch stopper layer on the substrate;
   forming a phase shift layer on the etch stopper layer;
   forming a photo resist layer on the phase shift layer;
   forming an impurity doped layer on the photo resist;
   energizing selected portions of the impurity doped layer with an electron beam to diffuse impurity into the resist so as to pattern the photo resist;
   removing the impurity doped layer;
   removing the non-patterned portions of the photo resist;
   using the patterned photo resist as a mask to selectively remove portions of the light shielding layer so as to form a light shielding pattern having open regions through which light can pass;
   selectively etching, for a number of areas exposed by the open regions, a first amount of the phase shift layer material to produce phase shift regions having a thickness of remaining phase shift layer material sufficient to induce a phase shift in light passing therethrough;
   eliminating a defect in a phase shift region by simultaneously selectively etching a second amount of phase shift layer material in each of the defective phase shift region and a portion of the phase shift layer exposed by an adjacent open region, such that the defective phase shift region is converted to a non-phase-shifting region and the adjacent open region is converted to a phase shift region.

18. A method as claimed in claim 17, wherein the step of providing a substrate includes using a light transmissive material as the substrate.

19. A method as claimed in claim 17, wherein the step of selectively removing to produce phase shift regions includes using alternate open regions for the selective removal of the phase shift layer material.

20. A method as claimed in claim 17, wherein each step of forming a light shielding pattern includes using an inorganic resist including chrome or silver.

21. A method as claimed in claim 17, wherein the step of forming a phase shift layer includes using a material including SOG or SiO$_2$ as the phase shift layer.

22. A method as claimed in claim 17, wherein the step of selectively removing to produce phase shift regions includes setting the thickness of the remaining phase shift layer material according to the following equation:

$$d=\lambda/2(n-1),$$

where d is the thickness required for phase shifting, λ is a wavelength of a light source, and n is a refractive index of the phase shift layer material.

23. A method as claimed in claim 17, wherein the step of eliminating a defect by simultaneously selectively removing includes etching the phase shift layer.

24. A method as claimed in claim 17, wherein a step of selectively removing to produce phase shift regions includes setting the thickness of the phase shift layer in the phase shift regions to be 1.5d~3.0d, where d is a thickness required for phase shifting.

25. A method as claimed in claim 17, wherein the step of forming an impurity doped layer includes using a material including silver.

26. A method as claimed in claim 17, wherein the step of forming the photo resist includes using an inorganic material as the photo resist.

27. A method as claimed in claim 1, wherein the step of eliminating a defect includes setting the second amount to be equal to the first amount.

28. A method as claimed in claim 1, wherein the step of selectively removing portions of the light shielding layer includes using an electron beam to define the portions of the light shielding layer to be removed.

29. A method as claimed in claim 9, wherein the step of selectively removing to produce the phase shift regions includes using alternate open regions for the selective removal of the phase shift layer material.

30. A method as claimed in claim 9, wherein the step of eliminating a defect includes setting the second amount to be equal to the first amount.

31. A method as claimed in claim 17, wherein the step of eliminating a defect includes setting the second amount to be equal to the first amount.

32. A method for correcting a defect in a phase mask comprising the steps of:

provide a substrate;

forming a phase shift layer over the substrate;

forming a patterned light shielding layer on the phase shift layer, the light shielding pattern having open regions through which light can pass;

forming phase shift regions in selected areas of the phase shift layer exposed by the open regions such that the phase shift regions alternate with non-phase-shift regions exposed by the remaining open regions;

correcting a defect in a phase shift region by simultaneously converting the defective phase shift region into a non-phase-shift region while converting an adjacent non-phase-shift region into a phase shift region.

33. A method as claimed in claim 32, wherein the step of correcting includes removing a same amount of phase shift layer material from the defective phase shift region and the adjacent non-phase-shift region.

34. A method as claimed in claim 32, further comprising:

forming an etch stopper layer on the substrate;

wherein the step of forming the phase shift layer includes forming the phase shift layer on the etch stopper layer.

35. A method as claimed in claim 32, wherein the step of forming a patterned light shielding layer includes:

forming a light shielding layer on the phase shift layer;

selectively removing portions of the light shielding layer to form a light shielding pattern having open regions through which light can pass.

36. A method as claimed in claim 35, wherein the step of forming phase shift regions includes selectively removing, for a number of areas exposed by the open regions, a first amount of the phase shift layer material to produce phase shift regions having a thickness of remaining phase shift layer material sufficient to induce a phase shift in light passing therethrough.

37. A method as claimed in claim 36, wherein the step of correcting a defect includes simultaneously selectively removing a second amount of phase shift layer material in each of the defective phase shift region and a portion of the phase shift layer exposed by an adjacent open region, such that the defective phase shift region is converted to a non-phase-shifting region and the adjacent open region is converted to a phase shift region.

* * * * *